United States Patent
Nimura et al.

(10) Patent No.: US 7,496,331 B2
(45) Date of Patent: Feb. 24, 2009

(54) OSCILLATION DEVICE AND OSCILLATION METHOD

(75) Inventors: Yoshihiko Nimura, Hara (JP); Naoki Ogura, Chino (JP)

(73) Assignee: Seiko Epson Corporation (JP)

( * ) Notice: Subject to any disclaimer, the term of this patent is extended or adjusted under 35 U.S.C. 154(b) by 514 days.

(21) Appl. No.: 11/248,117

(22) Filed: Oct. 12, 2005

(65) Prior Publication Data
US 2006/0105734 A1 May 18, 2006

(30) Foreign Application Priority Data
Nov. 16, 2004 (JP) ............... 2004-331462

(51) Int. Cl.
*H04B 1/40* (2006.01)
*H04B 7/00* (2006.01)
(52) U.S. Cl. .................. 455/76; 455/255; 455/258; 331/16
(58) Field of Classification Search .................. 455/76, 455/85–86, 255–265; 331/158, 177, 179, 331/185, 1 A, 16, 28, 25
See application file for complete search history.

(56) References Cited

U.S. PATENT DOCUMENTS

| | | | | |
|---|---|---|---|---|
| 5,534,826 A | * | 7/1996 | Logan | 331/158 |
| 6,011,447 A | * | 1/2000 | Iwasaki | 331/185 |
| 6,057,742 A | * | 5/2000 | Prado | 331/158 |
| 6,901,012 B2 | * | 5/2005 | Ikehashi et al. | 365/189.15 |
| 2001/0017566 A1 | * | 8/2001 | Nakahara | 327/536 |
| 2002/0171500 A1 | * | 11/2002 | Hasegawa et al. | 331/179 |
| 2004/0120204 A1 | * | 6/2004 | Kanda et al. | 365/225.7 |
| 2006/0017518 A1 | * | 1/2006 | Wilcox | 331/185 |

FOREIGN PATENT DOCUMENTS

| | | |
|---|---|---|
| JP | 62-236019 | 10/1987 |
| JP | 05-048440 | 2/1993 |
| JP | 05-048441 | 2/1993 |
| JP | 05-048442 | 2/1993 |
| JP | 2004-015544 | 1/2004 |

* cited by examiner

*Primary Examiner*—Simon D Nguyen
(74) *Attorney, Agent, or Firm*—Harness, Dickey & Pierce, P.L.C.

(57) ABSTRACT

An oscillation device, includes: an oscillator circuit that generates an oscillation signal based on a direct current voltage to be inputted, the oscillation signal being provided with a specification requested by a supplied device that is supposed to receive a supply of the oscillation signal; a gate circuit provided in the subsequent stage of the oscillator circuit and capable of outputting the oscillation signal from the oscillator circuit towards the supplied device; a power supply monitor circuit for detecting that the direct current voltage to be inputted has reached a voltage at which the oscillator circuit is able to start to generate the oscillation signal; and a delay circuit that causes the gate circuit to output to the supplied device the oscillation signal from the oscillator circuit, when a time required for the state of the oscillation signal, which the oscillator circuit generates, to become substantially constant is clocked on the basis of a time when a notice of the detection is received from the power supply monitor circuit, and the clocking is completed.

7 Claims, 7 Drawing Sheets

OSCILLATION DEVICE AND OSCILLATION METHOD

BACKGROUND OF THE INVENTION

1. Technical Field

The present invention relates to an oscillation device for generating an oscillation signal used in electronic apparatus such as cellular phones and personal computers, and relates to an oscillation method.

2. Related Art

Conventionally, the semiconductor integrated circuits described in the following patent Documents which are the above-described oscillation device, include an oscillator for generating the oscillation signal. In the semiconductor integrated circuits, when an input voltage is applied, a waiting time sufficient for stabilization is waited in order to stabilize the generation of the oscillation signal by the oscillator before outputting the oscillation signal to the electronic apparatus or the like from the oscillator, or before permitting a frequency dividing section or the like provided in the subsequent stage of the oscillator to start the frequency dividing operation or the like of the oscillation signal. More specifically, in the semiconductor integrated circuits, waiting for the waiting time is carried out by counting pulses or carried out with a time constant provided by a resistor and a capacitor.

Japanese Unexamined Patent Publication No. 5-48440 is a first example of the related art.

Japanese Unexamined Patent Publication No. 5-48441 is a second example of the related art.

Japanese Unexamined Patent Publication No. 5-48442 is a third example of the related art.

However, in the conventional semiconductor integrated circuits described above, for example, disturbing pulses may be counted, and the capacitor may not function as the delay element with respect to the input voltage that increases or decreases slowly. For these reasons, the waiting time can not be waited, and as a result, a start of outputting of the oscillation signal to the electronic apparatus or the like from the oscillator, and a start of the frequency dividing operation or the like of the frequency dividing section or the like are permitted before the generation of the oscillation signal becomes stable, and thereby, it is likely that the electronic apparatus or the like malfunctions due to this unstable oscillation signal.

SUMMARY

According to an aspect of the invention, the oscillation device includes: an oscillator circuit that generates an oscillation signal based on a direct current voltage to be inputted, the oscillation signal being provided with a specification requested by a supplied device that is supposed to receive a supply of the oscillation signal; a gate circuit provided in the subsequent stage of the oscillator circuit and capable of outputting the oscillation signal from the oscillator circuit towards the supplied device; a power supply monitor circuit for detecting that the direct current voltage to be inputted has reached a voltage at which the oscillator circuit is able to start to generate the oscillation signal; and a delay circuit that causes the gate circuit to output to the supplied device the oscillation signal from the oscillator circuit, when a time required for the state of the oscillation signal, which the oscillator circuit generates, to become substantially constant is clocked on the basis of a time when a notice of the detection is received from the power supply monitor circuit, and this clocking is completed.

According to the oscillation device concerning the invention, the oscillation signal is outputted to the supplied device when the time required for the state of the oscillation signal to become substantially constant, on the basis of the time when the direct current voltage to be inputted has reached the voltage at which the generation of the oscillation signal by the oscillator circuit becomes possible, has been clocked. Accordingly, unlike the conventional oscillation devices, the stable oscillation signal can be supplied to the supplied device, and thereby, it is possible to prevent the oscillation device from producing the conventional malfunctions.

It is preferable that the oscillation device concerning the invention further include at least one of a frequency divider circuit that outputs a frequency-divided signal by dividing the oscillation signal from the gate circuit, the frequency-divided signal being a signal divided from the oscillation signal, and an output circuit that amplifies the oscillation signal from the gate circuit or the frequency-divided signal from the frequency divider circuit and outputs it to the supplied device.

In the oscillation device concerning the invention, it is also preferable that at least one of the gate circuit, the frequency divider circuit, and the output circuit, carry out an output operation of from the relevant circuit to the supplied device in response to an output enable/disable signal that provides the enabling/disabling of the output operation.

It is also preferable that the oscillation device concerning the invention further include a second gate circuit that controls a notice of the detection to the delay circuit by the power supply monitor circuit, wherein the oscillator circuit carries out the oscillation operation in response to a standby signal that provides the enabling/disabling of the oscillation operation and the control operation by the second gate circuit, and the delay circuit carries out the clocking operation in response to the notice of the detection via the second gate circuit.

According to another aspect of the invention, an oscillation method includes: an oscillation step for generating an oscillation signal based on a direct current voltage to be inputted; and an output step that outputs the oscillation signal when a time required for the state of the oscillation signal, which the oscillation step generates, to become substantially constant has lapsed on the basis of a time when the direct current voltage to be inputted has reached a voltage at which the oscillation step is able to start to generate the oscillation signal.

BRIEF DESCRIPTION OF THE DRAWINGS

The invention will be described with reference to the accompanying drawings, wherein like numbers refer to like elements, and wherein.

DESCRIPTION OF THE EMBODIMENTS

Embodiments of the oscillation device concerning the invention will be described with reference to the accompanying drawings.

Configuration

Figure 1:
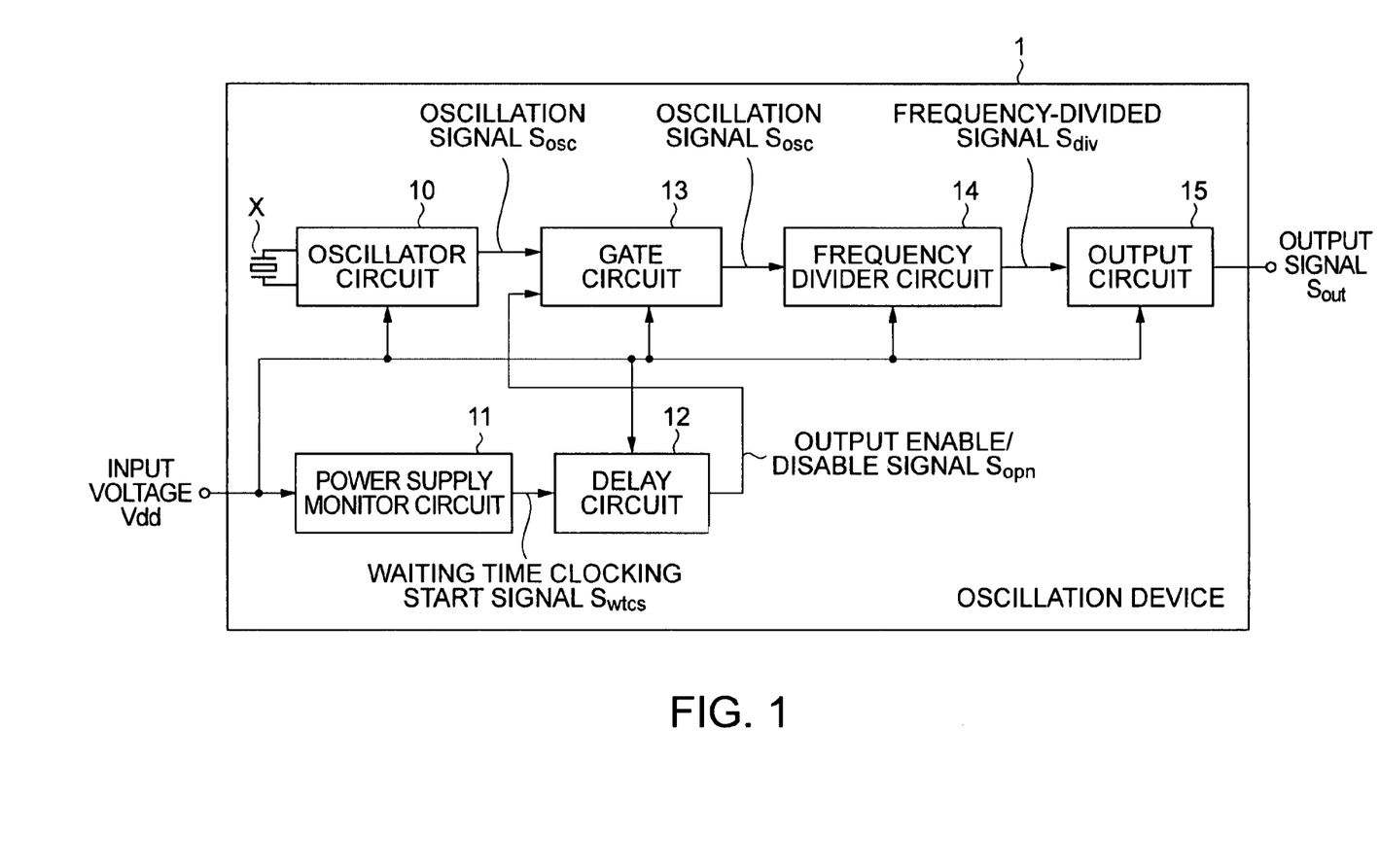
FIG. 1 is a view showing a configuration of an oscillation device of an embodiment.

FIG. 1 shows the configuration of an oscillation device of an embodiment. As shown in FIG. 1, an oscillation device 1 of the embodiment generates an output signal Sout based on a direct current voltage Vdd, which is a positive voltage and applied from an external direct current power supply (not shown) such as a lithium cell, the output signal Sout being provided with a specification (for example, an amplitude, a frequency, or the like) requested by CPU, a logic circuitry, or the like in a supplied device (not shown) such as a cellular phone and a personal computer, and the oscillation device 1 includes an oscillator circuit 10, a power supply monitor circuit 11, a delay circuit 12, a gate circuit 13, a frequency divider circuit 14, and an output circuit 15 in order to output the output signal Sout to the supplied device.

The oscillator circuit 10, having a conventionally known configuration such as a Colpitts circuit, generates an oscillation signal Sosc having an oscillation frequency specified by a piezoelectric vibrator X based on the piezoelectric vibrator X such as a quartz resonator and a SAW resonator, and outputs the oscillation signal Sosc to the gate circuit 13.

Figure 2:
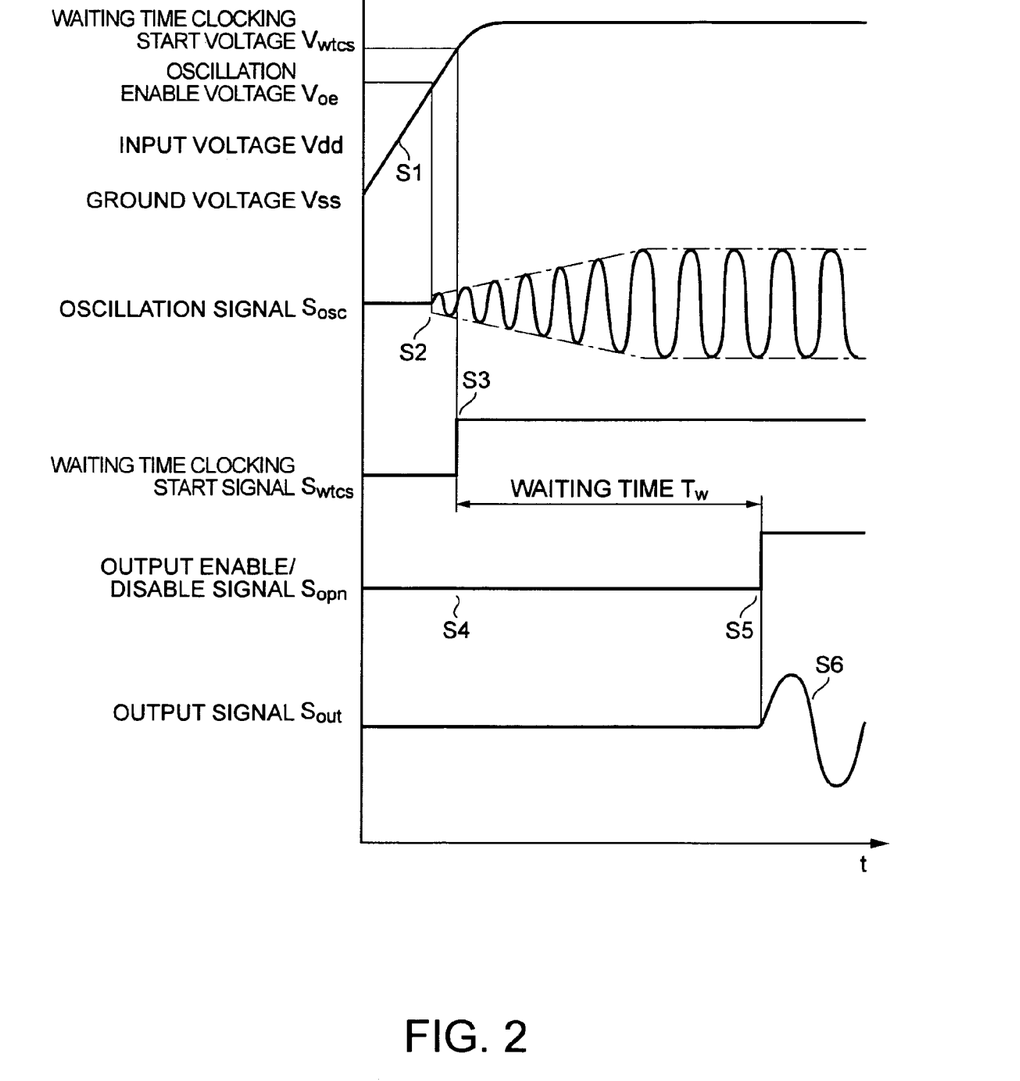
FIG. 2 is a time chart illustrating an operation of the oscillation device of the embodiment.

Immediately after the direct current voltage Vdd is applied to the oscillation device 1, in other words, during the transition period of changing from the state where the direct current voltage Vdd is not applied yet from the direct current power supply to the state where it is being applied, when the power supply monitor circuit 11 detects a fact that, by monitoring the rising of the direct current voltage Vdd, the direct current voltage Vdd has reached a waiting time clocking start voltage Vwtcs, which is higher than a oscillatable voltage Voe, the voltage Voe being the lower limit voltage at which voltage the oscillator circuit 10 is able to oscillate, and which is lower than the direct current voltage Vdd, the waiting time clocking start voltage Vwtcs being the voltage at which the clocking of a waiting time Tw to be described below is supposed to start, the power supply monitor circuit 11 will output to the delay circuit 12 a waiting time clocking start signal Swtcs indicative of this fact. Here, as shown in FIG. 2, the "waiting time Tw", is a time required for the state of the oscillation signal Sosc, which the oscillator circuit 10 generates, to become substantially constant, on the basis of a time when the direct current voltage Vdd has reached an oscillatable voltage Voe.

The delay circuit 12 is provided in the subsequent stage of the power supply monitor circuit 11, and starts to clock the waiting time Tw in response to the waiting time clocking start signal Swtcs from the power supply monitor circuit 11, and when the delay circuit 12 completes the clocking of the waiting time Tw, it will output to the gate circuit 13, in order to notice of this fact, an output enable/disable signal Sopn that permits the gate circuit 13 to output the oscillation signal Sosc generated by the oscillator circuit 10 to the frequency divider circuit 14.

The gate circuit 13 is provided in the subsequent stage of the oscillator circuit 10, and is comprised of, for example, a NAND circuit, a NOR circuit, or a clocked-inverter circuit. When the output enable/disable signal Sopn outputted from the delay circuit 12 indicates "enabling", the gate circuit 13 outputs the oscillation signal Sosc from the oscillator circuit 10 to the frequency divider circuit 14 of the subsequent stage, and on the contrary, when the output enable/disable signal Sopn indicates "disable", the gate circuit 13 will not output the oscillation signal Sosc to the frequency divider circuit 14.

The frequency divider circuit 14, being provided in the subsequent stage of the gate circuit 13, will output to the output circuit 15 a frequency-divided signal Sdiv, which, for example, corresponds to the signal divided by 2 or the signal divided by 4 of the oscillation signal Sosc, by dividing the oscillation signal Sosc outputted from the gate circuit 13 in order to generate a signal whose frequency is lower than the frequency of the oscillation signal Sosc.

The output circuit 15, being provided in the subsequent stage of the frequency divider circuit 14, will amplify, for example, current-amplify the frequency-divided signal Sdiv outputted from the frequency divider circuit 14, and outputs to the supplied device the output signal Sout which is the current-amplified frequency-divided signal Sdiv.

Operation

FIG. 2 is a time chart illustrating the operation of the oscillation device of the embodiment. Hereinafter, the operation of the oscillation device 1 of the embodiment will be described with reference to FIG. 2.

As to the initial state of the oscillation device 1, the oscillator circuit 10 does not carry out any oscillation operation because the direct current voltage Vdd has not been applied yet to the oscillator circuit 10 at the beginning, and since the output enable/disable signal Sopn indicates "disabling" at the beginning, the gate circuit 13 has not outputted any signal yet to the frequency divider circuit 14.

Step S1: When a switch (not shown) for an external direct current power supply is switched from OFF to ON, the direct current power supply will apply the input voltage Vdd to the oscillation device 1, more precisely, will start to apply the input voltage Vdd.

Step S2: As shown in FIG. 2, when the direct current voltage Vdd rises gradually from the ground potential Vss (0V) and reaches the oscillatable voltage Voe, the oscillator circuit 10 will start to generate the oscillation signal Sosc, as shown in this view. Other circuits except the oscillator circuit 10, i.e., the power supply monitor circuit 11 through the output circuit 15 will also start the operation of each circuit or will stand by in order to start the relevant operation when the direct current voltage Vdd reaches a voltage at which each circuit can operate.

Step S3: As shown in FIG. 2, when the direct current voltage Vdd rises further, exceeds the oscillatable voltage Voe and reaches the waiting time clocking start voltage Vwtcs, the power supply monitor circuit 11 will detect this fact and output to the delay circuit 12 the waiting time clocking start signal Swtcs which indicates a fact of the detection with the rising edge, in order to notify of the detection, as shown in FIG. 2.

Step S4: When the waiting time clocking start signal Swtcs indicative of the fact of the detection is outputted from the power supply monitor circuit 11, the delay circuit 12 will start clocking of the waiting time Tw, as shown in FIG. 2.

Step S5: Upon completion of the clocking of the waiting time Tw, the delay circuit 12 will output to the gate circuit 13 the output enable/disable signal Sopn that indicates a fact of the completion of the clocking with the rising edge.

Step S6: Upon receipt of the output enable/disable signal Sopn indicative of a fact of the completion of the clocking of the waiting time Tw, the gate circuit 13 will start outputting to the frequency divider circuit 14 the oscillation signal Sosc generated by the oscillator circuit 10, in response to the output enable/disable signal Sopn. Upon receipt of the input of the oscillation signal Sosc, the frequency divider circuit 14 will generate the frequency-divided signal Sdiv by dividing the oscillation signal Sosc, and will output the frequency-divided signal Sdiv to the output circuit 15. Upon input of the frequency-divided signal Sdiv, the output circuit 15 will current-amplify the frequency-divided signal Sdiv, and thereafter, output this as the output signal Sout to the supplied device, as shown in FIG. 2.

Effect

As described above, in the oscillation device 1 of the embodiment, the power supply monitor circuit 11 monitors the rising of the direct current voltage Vdd to be applied, and when it detects that the direct current voltage Vdd has reached the waiting time clocking start voltage Vwtcs which is a voltage higher than the oscillatable voltage Voe at which the oscillator circuit 10 can oscillate, it will output the waiting time clocking start signal Swtcs to the delay circuit 12. With this waiting time clocking start signal Swtcs being as a trigger, the delay circuit 12 will start clocking of the waiting time Tw which is the time required for the state of the oscillation signal Sosc to becomes substantially constant, and when the clocking of the waiting time Tw is completed, the delay circuit 12 will output to the gate circuit 13 the output enable/disable signal Sopn that permits the outputting of the oscillation signal Sosc. In response to the output enable/disable signal Sopn, the gate circuit 13 outputs the oscillation signal Sosc to the frequency divider circuit 14, the frequency divider circuit 14 generates the frequency-divided signal Sdiv by dividing the oscillation signal Sosc, and the output circuit 15 outputs the output signal Sout by applying a current amplification to the frequency divided circuit Sdiv. Accordingly, the oscillation device 1 can output to the supplied device the output signal Sout based on the oscillation signal Sosc that is stabilized to generate unlike in the past. Consequently, the supplied device can operate stably based on the stable output signal Sout without producing malfunctions, unlike in the past.

In the oscillation device 1 of the embodiment, the power supply monitor circuit 11 can also obtain the same effect described above by detecting that the input voltage Vdd reaches the oscillatable voltage Voe instead of detecting that the input voltage Vdd reaches the waiting time clocking start voltage Vwtcs.

In the oscillation device 1 of the embodiment, the same effect described above can be also obtained by receiving an application of the direct current voltage Vdd which is a negative voltage instead of receiving the direct current voltage Vdd which is a positive voltage.

Figure 3:
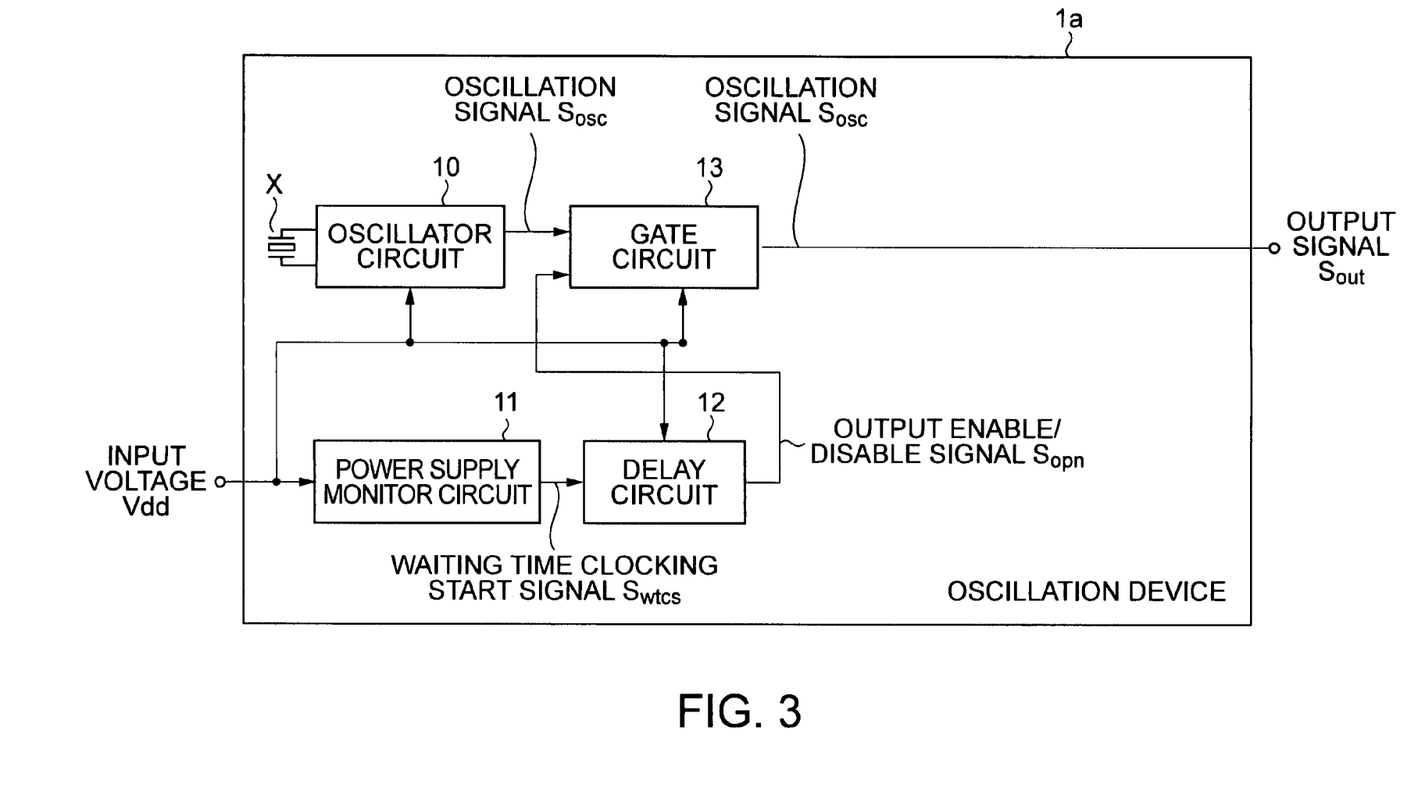
FIG. 3 is a view illustrating another configuration of an oscillation device of the embodiment (part 1)
Figure 4:
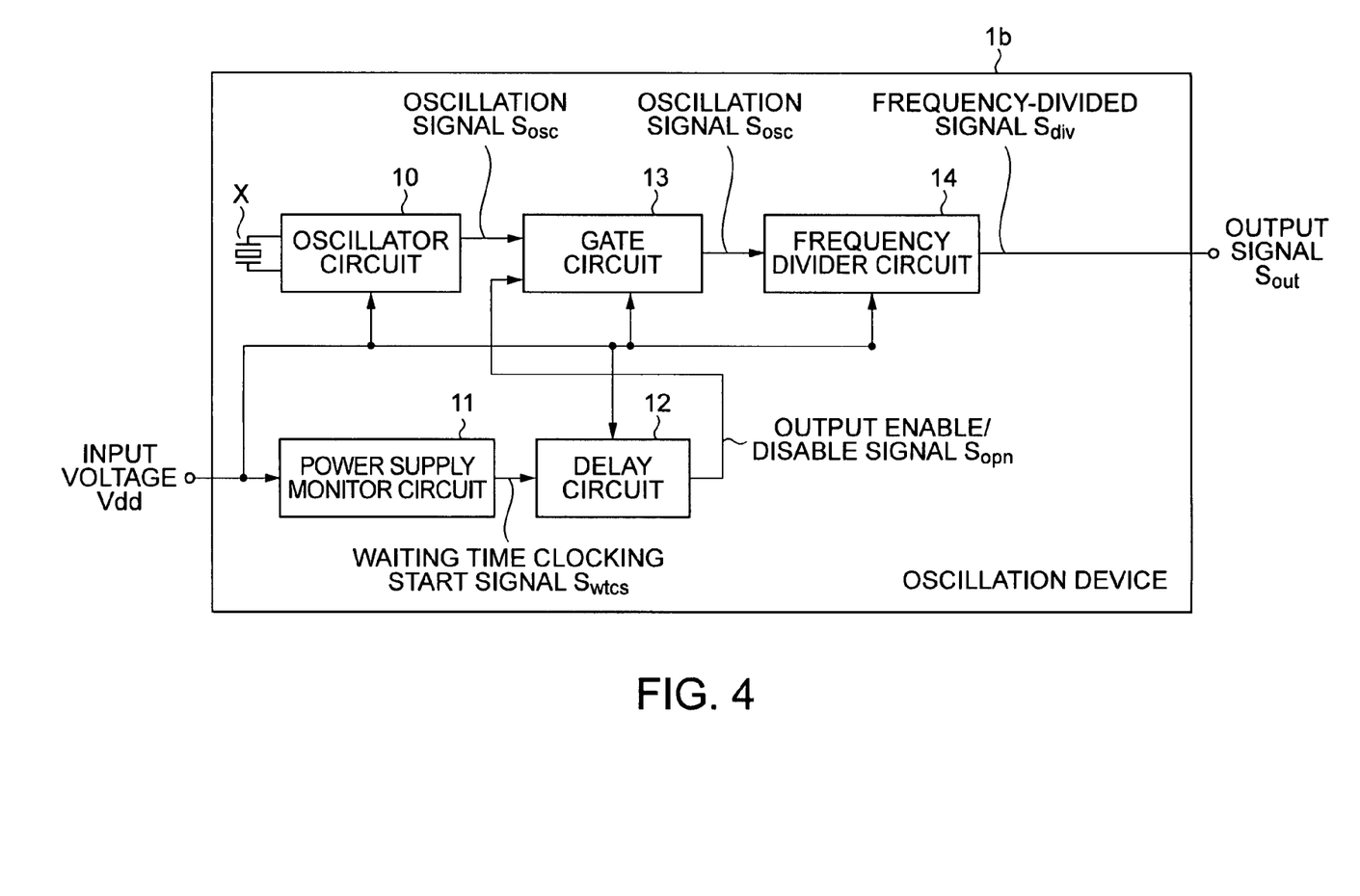
FIG. 4 is a view illustrating another configuration of an oscillation device of the embodiment (part 2)
Figure 5:
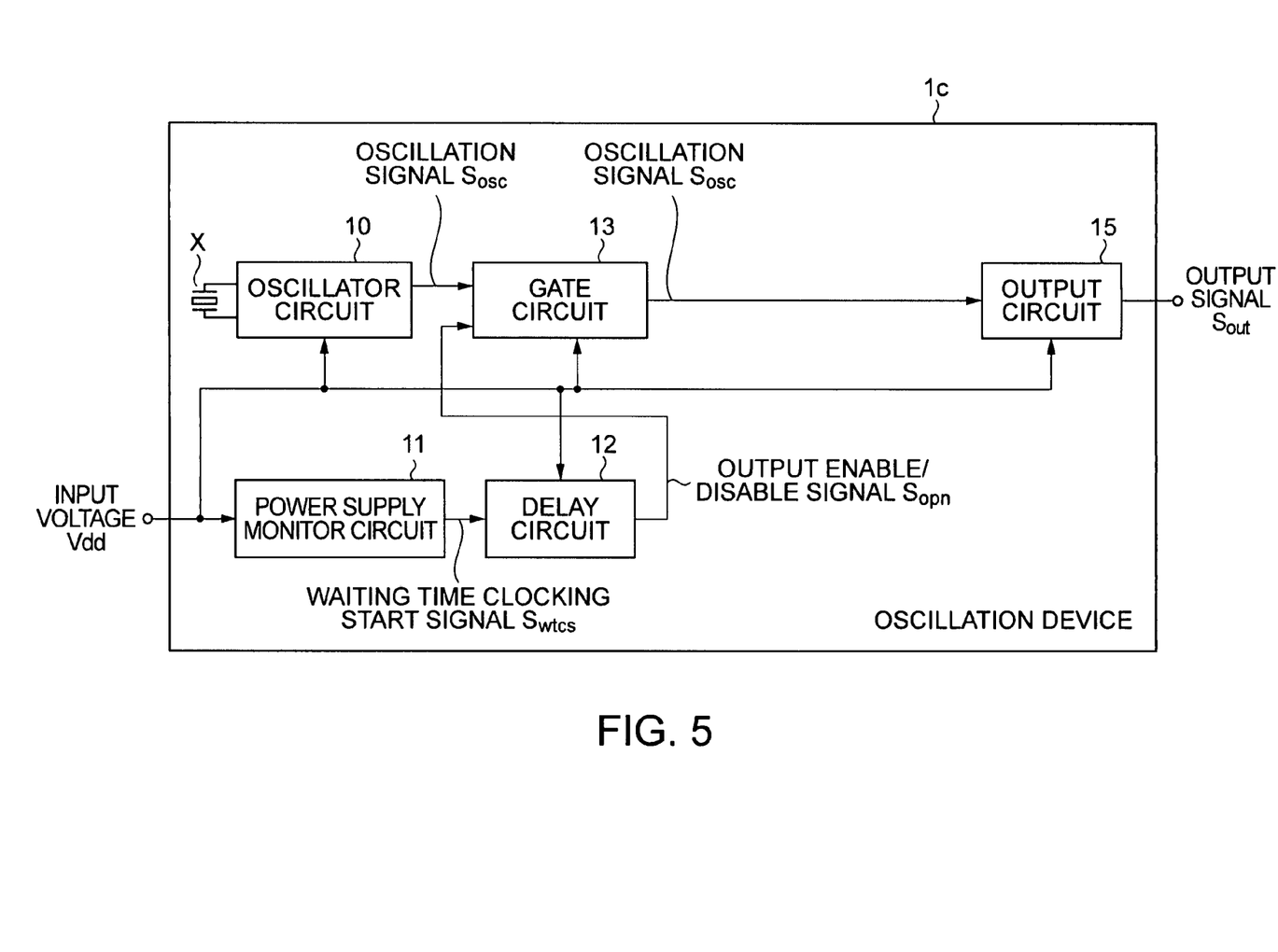
FIG. 5 is a view illustrating another configuration of an oscillation device of the embodiment (part 3)

Moreover, in the oscillation device 1 of the embodiment, in the case where it is unnecessary to divide the oscillation signal Sosc or unnecessary to apply a current amplification to the frequency-divided signal Sdiv, even if at least one of the frequency divider circuit 14 and the output circuit 15 is not provided, more precisely, even if the frequency divider circuit 14 and the output circuit 15 are not provided like an oscillation device 1a shown in FIG. 3, moreover, even if only the frequency divider circuit 14 is provided and the output circuit 15 is not provided like an oscillation device 1b shown in FIG. 4, and moreover, even if both the frequency divider circuit 14 and the output circuit 15 are not provided like an oscillation device 1c shown in FIG. 5, the same effect as the one described above can be obtained by outputting to the supplied device the oscillation signal Sosc outputted from the gate circuit 13, the frequency-divided signal Sdiv outputted from the frequency divider circuit 14, or the output signal Sout outputted from the output circuit.

Modification 1

Figure 6:
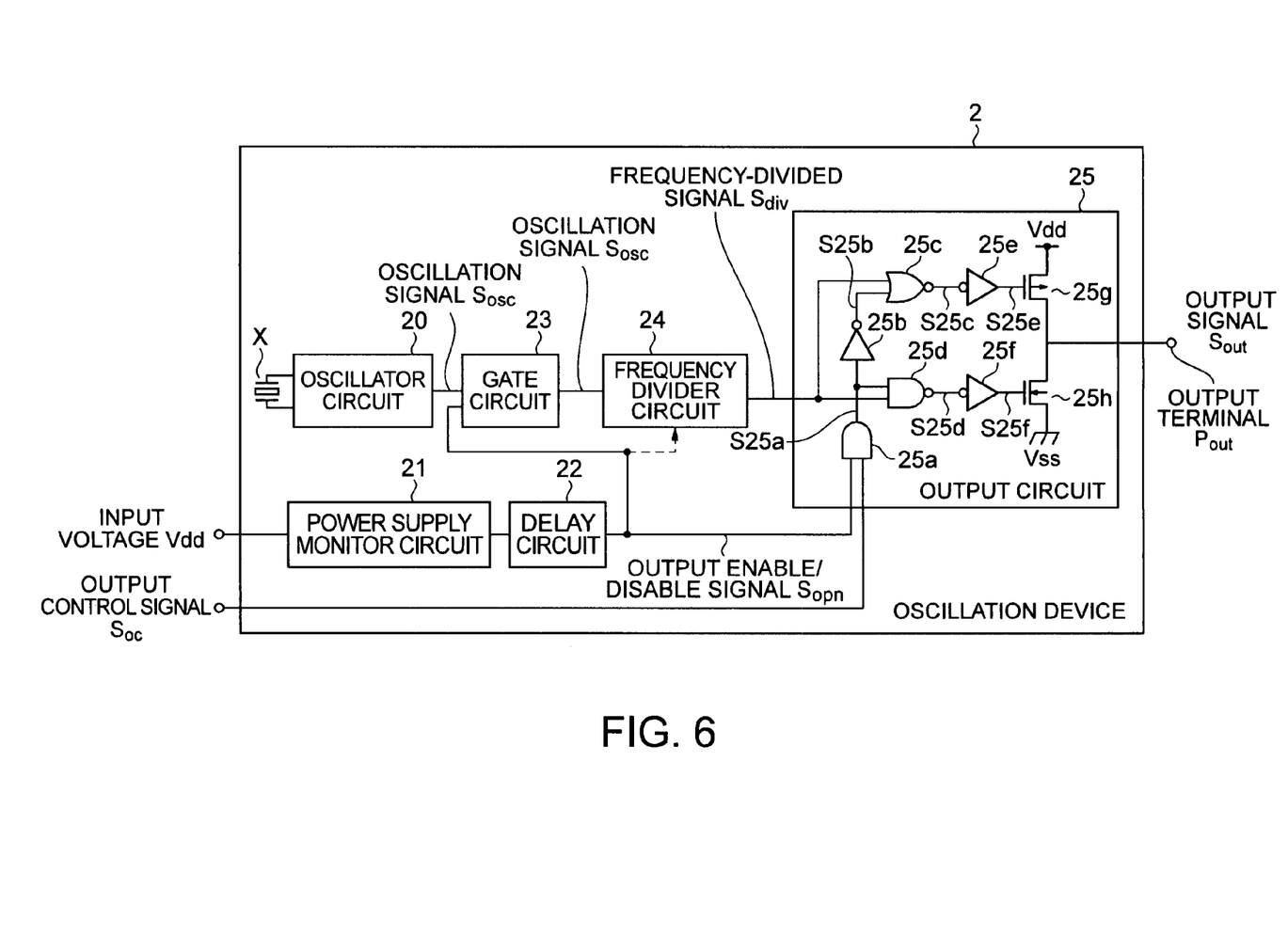
FIG. 6 is a view illustrating a configuration of an oscillation device of a modification 1.

FIG. 6 is a view illustrating a configuration of an oscillation device of a modification 1. Hereinafter, an oscillation device 2 of the modification 1 will be described with reference to FIG. 6.

Configuration

The oscillation device 2 of the modification 1 includes, like the oscillation device 1 of the embodiment shown in FIG. 1, an oscillator circuit 20 through a frequency divider circuit 24 corresponding to the oscillator circuit 10 through the frequency divider circuit 14 of the embodiment, and on the other hand, unlike the oscillation device 1 of the embodiment, it includes an output circuit 25 different from the output circuit 15 of the embodiment.

In order to or in order not to output the output signal Sout in response to an output control signal Soc for enabling or disabling the outputting of the output signal Sout provided from the outside (for example, CPU, logic circuitry, or the like in the supplied device), the output circuit 25 comprises an AND circuit 25a, an inverter circuit 25b, a NOR circuit 25c, a NAND circuit 25d, inverter circuits 25e and 25f, a PMOS transistor 25g, and an NMOS transistor 25h, as shown in FIG. 6.

Operation

In the output circuit 25, when the output control signal Soc of a low level for "disabling" the output operation of the output signal Sout is inputted, the AND circuit 25a will output a signal S25a of a low level regardless of the contents of the output enable/disable signal Sopn from the delay circuit 22. The inverter circuit 25b outputs a signal S25b of a high level in response to the signal S25a of a low level. When the signal S25b of a high level is inputted to one of the input terminals, the NOR circuit 25c outputs a signal S25c of a low level regardless of the contents of the frequency-divided signal Sdiv from the frequency divider circuit 24, the contents to be inputted to the other input terminal thereof. In response to the signal S25c of a low level, the inverter circuit 25e will output a signal S25e of a high level, and consequently, the PMOS transistor 25g will be turned off, i.e., be in a high impedance state.

On the other hand, when the signal S25a of a low level is inputted to one of the input terminal, the NAND circuit 25d will output a signal S25d of a high level regardless of the contents of the frequency-divided signal Sdiv from the frequency divider circuit 24, the contents to be inputted to the other input terminal thereof. On receipt of an input of the signal S25d of a high level, the inverter circuit 25f will output a signal S25f of a low level. Accordingly, the NMOS transistor 25h also becomes in an OFF state, namely, becomes in a high impedance state. In summary, when the output control signal Soc of a low level indicative of "disabling" of the output, both the PMOS transistor 25g and the NMOS transistor 25h will be in a high impedance state, and thus no signals will be outputted at an output terminal Pout.

By contrast, if assuming that the output enable/disable signal Sopn from the delay circuit 22 has already reached to a high level through Step S5 as shown in FIG. 2, in other words, if assuming that the output enable/disable signal Sopn of a high level is applied to the other input terminal of the AND circuit 25a and to the other input terminal of the NOR circuit 25c, then the AND circuit 25a will output the signal S25a of a high level because the output control signal Soc of a high level for "enabling" the output operation of the output signal Sout is inputted to the other input terminal. Upon receipt of the signal S25a of a high level, the inverter circuit 25b will output the signal S25b of a low level. When the signal S25b of a low level is inputted to one of the input terminals, the NOR circuit 25c will output the signal S25c, which is to be inputted to the other input terminal thereof and is the frequency-divided signal Sdiv from the frequency divider circuit 24. When the signal S25c is inputted, the inverter circuit 25e will output a signal S25e which is the inverted signal of the signal S25c. In this manner, the PMOS transistor 25g will be turned on or turned off in response to the signal S25e, namely, a power supply voltage Vdd is outputted to the output terminal Pout, or the output terminal Pout is made to be in a high impedance state.

On the other hand, when the signal S25a of a high level is inputted to one of the input terminals, the NAND circuit 25d will output, as the signal S25d, the frequency-divided signal Sdiv from the frequency divider circuit 24, as the NOR circuit 25c will output. When the signal S25d is inputted, the inverter circuit 25f will output the signal S25f which is the inverted signal of the signal S25d. In this manner, the NMOS transistor 25h is turned off and turned on in response to the signal S25f, namely, the output terminal Pout is made to be in a high impedance state, or the ground voltage Vss is outputted to the output terminal Pout.

Here, the signals S25e and 25f are always in an identical level, more specifically, if the signal S25e is in a high level, the signal S25f is also in a high level, and moreover, if the signal S25e is in a low level, the signal S25f is also in a low level, and therefore, the both transistors (the PMOS transistor 25g and NMOS transistor 25h) will not turn on simultaneously, or not turn off simultaneously. More specifically, they will switch so that only one of them is turned on and only the other one is turned off like typical CMOS transistors. As a result, to the output terminal Pout, the power supply voltage Vdd or the ground voltage Vss is selectively outputted as the output signal Sout, namely, the frequency-divided signal Sdiv is actually outputted.

Effect

As described above, in the oscillation device 2 of the modification 1, when the output control signal Soc applied from the outside of the oscillation device 2 is in a low level indicative of "disabling" of the output, the output circuit 25 will not output the frequency-divided signal Sdiv as the output signal Sout, and moreover, it makes the output terminal Pout to be in a high impedance state, and on the other hand, when the output control signal Soc is in a high level indicative of "enabling" of the output, the output circuit 25 will output the frequency-divided signal Sdiv to the output terminal Pout. Accordingly, the oscillation device 2 of the modification 1, like the oscillation device 1 of the embodiment, can output, as the output signal Sout, the frequency-divided signal Sdiv generated based on the stable oscillation signal Sosc after an application of the direct current voltage Vdd. In addition, under control of the output enable/disable signal Sopn provided from the outside, the oscillation device 2 can output the frequency-divided signal Sdiv to the output terminal Pout or carry out an operation of causing the output terminal Pout to be in a high impedance state instead of outputting it.

In the oscillation device 2 of the modification 1, as indicated by an arrow of the dotted line of FIG. 6, by outputting the output enable/disable signal Sopn from the delay circuit 22 to the frequency divider circuit 24 in addition to by outputted it to the gate circuit 23, the output operation of the frequency-divided signal Sdiv by the frequency divider circuit 24 is controlled, like the output operation of the oscillation signal Sosc by the gate circuit 23, and thereby the same effect described above can be obtained.

Modification 2

Figure 7:
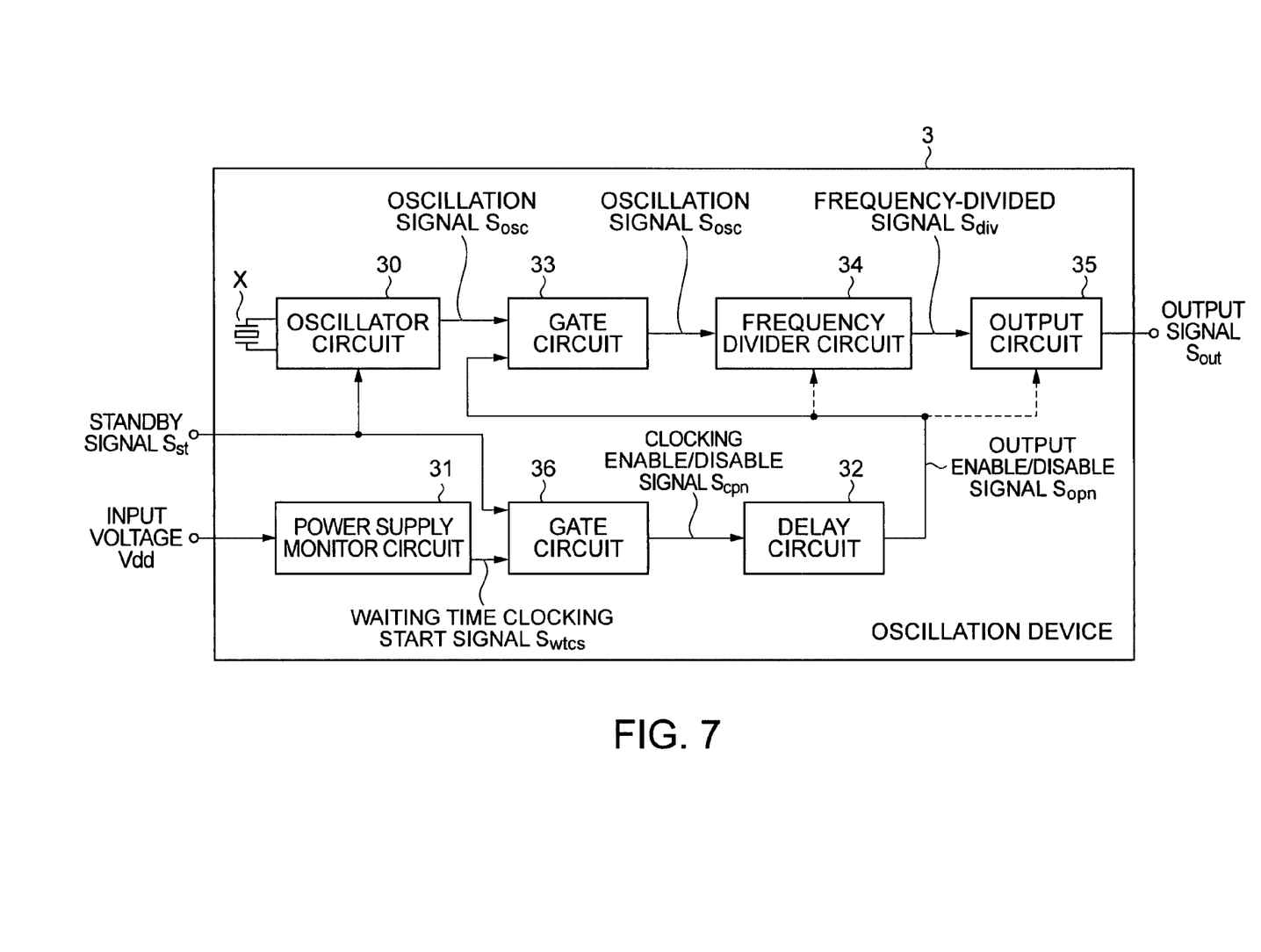
FIG. 7 is a view illustrating a configuration of an oscillation device of a modification 2.

FIG. 7 is a view illustrating a configuration of an oscillation device of a modification 2. Hereinafter, an oscillation device 3 of the modification 2 will be described with reference to FIG. 7.

Configuration

The oscillation device 3 of the modification 2 includes an oscillator circuit 30 through an output circuit 35 having the same configuration and same function as those of the oscillator circuit 10 through the output circuit 15 and the oscillator circuit 20 through the output circuit 25 in the oscillation device 1 of the embodiment illustrated in FIG. 1 and in the oscillation device 2 of the modification 1 illustrated in FIG. 6. On the other hand, the oscillation device 3 further includes a gate circuit 36 unlike the oscillation device 1 of the embodiment and the oscillation device 2 of the modification 1, and a standby signal Sst provided from the outside of the oscillation device 3 for controlling the operations of the oscillator circuit 30 and the delay circuit 32, namely, the standby signal Sst that controls the generation of the oscillation signal Sosc by the oscillator circuit 30 and the clocking of the waiting time Tw by the delay circuit 32 is provided to the oscillator circuit 30 and to the gate circuit 36.

The gate circuit 36, being provided in between the power supply monitor circuit 31 and the delay circuit 32, is comprised of, for example, an AND circuit. Again, in the gate circuit 36, the waiting time clocking start signal Swtcs from the power supply monitor circuit 31 is inputted to one of the input terminals, and the standby signal Sst is inputted to the other input terminal.

Operation

When the standby signal Sst is in a low level that "disables" the oscillation operation of the oscillator circuit 30 and the clocking operation of the delay circuit 32, the oscillator circuit 30 will not carry out the oscillation operation, and the gate circuit 36 will output to the delay circuit 32 the clocking enable/disable signal Scpn of a low level indicative of "disabling" of the clocking operation regardless of the contents of the waiting time clocking signal start signal Swtcs to be outputted from the power supply monitor circuit 31, and the delay circuit 32 will not carry out the clocking operation in response to the clocking enable/disable signal Scpn, and as a result, it will output the output enable/disable signal Sopn of a low level that "disables" any signal to be outputted to the frequency divider circuit 34, any signal being inputted to the gate circuit 33 from the oscillator circuit 30. In response to the output enable/disable signal Sopn, the gate circuit 33 will not output any signals outputted from the oscillator circuit 30, to the frequency divider circuit 34.

On the other hand, when the standby signal Sst is in a high level, which "enables" the oscillation operation of the oscillator circuit 30 and the clocking operation of the delay circuit 32, the oscillator circuit 30 carries out the oscillation operation, i.e., the generation of the oscillation signal Sosc. Moreover, based on the clocking enable/disable signal Scpn of a high level which the gate circuit 36 outputs in response to the standby signal Sst of a high level which "enables" the clocking operation, the delay circuit 32 carries out the clocking operation of the waiting time Tw, and after completion of the clocking, the gate circuit 33 through the output circuit 35, which operate in a similar manner as the gate circuit 13 through the output circuit 15 in the oscillation device 1 of the embodiment, will collaborate to output the output signal Sout to the output terminal Pout.

Effect

As described above, in the oscillation device 3 of the modification 2, the oscillation operation of the oscillator circuit 30 is enabled or disabled by the standby signal Sst, and in the same way, the clocking operation of the delay circuit 32 is enabled or disabled by the clocking enable/disable signal Scpn from the gate circuit 36 under control of the standby signal Sst. For this reason, in addition to be able to output the output signal Sout based on the stable oscillation signal Sosc, like the oscillation device 1 of the embodiment, for example, if there is no need to cause the oscillator circuit 30 to carry out the oscillation operation, the oscillation operation of the oscillator circuit 30 can be stopped, and due to the stop of the clocking operation in the delay circuit 32, any signals from the oscillator circuit 30 are not permitted to be outputted, and thus it is possible to cause the oscillation device 3 to start the operation and stop the operation at a timing as needed.

In the oscillation device 3 of the modification 2, as illustrated by an arrow of the dotted line in FIG. 7, also by outputting the output enable/disable signal Sopn from the delay circuit 32, to the frequency divider circuit 34 and to the output circuit 35, in addition to by outputting it to the gate circuit 33, the same effect as the one described above can be also obtained.

What is claimed is:

1. An oscillation device, comprising:
    an oscillator circuit that generates an oscillation signal based on a direct current voltage to be inputted, the oscillation signal being provided with a specification requested by a supplied device that is supposed to receive a supply of the oscillation signal;
    a gate circuit provided in the subsequent stage of the oscillator circuit and capable of outputting the oscillation signal from the oscillator circuit towards the supplied device;
    a power supply monitor circuit for detecting that the direct current voltage to be inputted has reached a voltage at which the oscillator circuit is able to start to generate the oscillation signal; and
    a delay circuit that causes the gate circuit to output to the supplied device the oscillation signal from the oscillator circuit, when a time required for the state of the oscillation signal, which the oscillator circuit generates, to become substantially constant is clocked on the basis of a time when a notice of the detection is received from the power supply monitor circuit, and the clocking is completed.

2. The oscillation device according to claim 1, further comprising at least one of a frequency divider circuit that outputs a frequency-divided signal by dividing the oscillation signal from the gate circuit, the frequency-divided signal being a signal divided from the oscillation signal, and an output circuit that amplifies the oscillation signal from the gate circuit or the frequency-divided signal from the frequency divider circuit and outputs ft to the supplied device.

3. The oscillation device according to claim , wherein at least one of the gate circuit, the frequency divider circuit, and the output circuit carries out an output operation of from the relevant circuit to the supplied device in response to an output enable/disable signai that provides the enabling/disabling of the output operation.

4. The oscillation device according to claim 3, further comprising a second gate circuit that controls a notice of the detection to the delay circuit by the power supply monitor circuit, wherein
    the oscillator circuit carries out the oscillation operation in response to a standby signal that provides the enabling/disabling of the oscillation operation and the control operation by the second gate circuit, and the delay circuit carries out the clocking operation in response to the notice of the detection via the second gate circuit.

5. An oscillation method, comprising:
    oscillating for generating an oscillation signal based on a direct current voltage to be inputted; and
    outputting the oscillation signal when a time required for the state of the oscillation signal, which the oscillation step generates, to become substantially constant has lapsed on the basis of a time when the direct current voltage to be inputted has reached a voltage at which the oscillation step is able to start to generate the oscillation signal;
    providing a gate circuit that outputs the oscillation signal to a supplied device; and
    providing a delay circuit that causes the pate circuit to output the oscillation signal when a time reguired for the state of the oscillation signal to become substantially constant is clocked based on a time when a notice of the detection is received.

6. An oscillation device, comprising:
    an oscillator circuit that generates an oscillation signal based on a direct current voltage;
    a gate circuit that receives the oscillation signal from the oscillator circuit and outputs the oscillation signal;
    a power supply monitor circuit that detects whether the direct current voltage is greater than a predetermined voltage and generates a detected signal when the direct current voltage is greater than the predetermined voltage;
    a delay circuit that causes the gate circuit to output the oscillation signal based on a predetermined period after the detected signal is received from the power supply monitor circuit.

7. The oscillation device according to claim 6 wherein the predetermined voltage is greater than a voltage required for the oscillator circuit to generate the oscillation signal.

* * * * *